(12) United States Patent
Nagatani

(10) Patent No.: US 6,563,188 B2
(45) Date of Patent: May 13, 2003

(54) SEMICONDUCTOR DEVICE HAVING MULTILAYER PASSIVATION LAYER FORMED OVER MEMORY CELL FUSE AREA

(75) Inventor: Hiroyuki Nagatani, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 10/140,953

(22) Filed: May 9, 2002

(65) Prior Publication Data
US 2003/0030124 A1 Feb. 13, 2003

(30) Foreign Application Priority Data
Aug. 8, 2001 (JP) ........................................ 2001-240264

(51) Int. Cl.[7] ............................................... H01L 29/00
(52) U.S. Cl. ....................... 257/529; 257/173; 257/209; 257/665; 438/467; 438/600; 438/601; 102/202.4; 361/275.1
(58) Field of Search ................................. 257/173, 209, 257/529, 665, 910; 102/202.4; 361/275.1; 438/467, 600, 601

(56) References Cited

U.S. PATENT DOCUMENTS 5,821,160 A * 10/1998 Rodriguez et al. .......... 438/601

FOREIGN PATENT DOCUMENTS

| JP | 9-51038 | 2/1997 | |
| JP | 09051038 A | * 2/1997 | .......... H01L/21/82 |
| JP | 2000-332114 | 11/2000 | |

* cited by examiner

Primary Examiner—Nathan J. Flynn
Assistant Examiner—Scott R. Wilson
(74) Attorney, Agent, or Firm—McDermott, Will & Emery

(57) ABSTRACT

A semiconductor device of the present invention is provided with a first metal wire formed above a semiconductor substrate with an interlayer insulating film intervened, a fuse formed on interlayer insulating film so as to be spaced at a distance away from first metal wire, an insulating film which covers first metal wire and which has an opening above fuse, a second metal wire formed on insulating film, a first passivation film which covers second metal wire and fuse, and a second passivation film formed on first passivation film, made of a material different from that of first passivation film and having an opening above fuse.

11 Claims, 5 Drawing Sheets

MEMORY CELL ARRAY PORTION    FUSE PORTION

MEMORY CELL ARRAY PORTION        FUSE PORTION

MEMORY CELL ARRAY PORTION        FUSE PORTION

SEMICONDUCTOR DEVICE HAVING MULTILAYER PASSIVATION LAYER FORMED OVER MEMORY CELL FUSE AREA

BACKGROUND OF THE INVENTION

1. Field of the Invention

The present invention relates to a semiconductor device and a process for the same, in particular, to a semiconductor device and a process for the same wherein the passivation film is multilayered and wherein at least a portion of the passivation film extends over a fuse.

2. Description of the Background Art

A DRAM (dynamic random access memory) is known as a conventional example of a semiconductor device. A process for metal wires and a fuse structure in such a DRAM is described in reference to FIGS. 7 to 9.

As shown in FIG. 7, a metal film is deposited above a semiconductor substrate with an interlayer insulating film intervened and this metal film is patterned. Thereby, a first metal wires 1 are formed in a memory cell array portion and a fuse 11 is formed in a fuse portion.

After that, an insulating film is deposited so as to cover first metal wires 1 and fuse 11. At this time, the insulating film is deposited so as to fill in the spaces between first metal wires 1, or between first metal wires 1 and fuse 11.

After the deposition of the above insulating film, this insulating film is flattening by means of CMP (chemical mechanical polishing) and another insulating film is deposited. At this time, the thickness of the insulating film is made to be great so as to reduce the difference in level due to first metal wires 1.

An insulating film 2 shown in FIG. 7 is formed through such a flattening process. Therefore, the thickness of insulating film 2 is great. This insulating film 2 is blown up when the fuse blows.

Insulating film 2 is selectively etched by using a photoresist mask and contact holes are created above first metal wires 1 so that a conductive layer is filled into the contact holes.

Next, a metal film is deposited on insulating film 2 and dry etching is carried out by using a photoresist mask so as to pattern this metal film. Thereby, a second metal wires 3 are formed in the memory cell array portion. At this time, no metal film remains above fuse 11.

Next, a passivation film 4 is deposited so as to cover second metal wires 3 and insulating film 2 in the fuse portion. After that, as shown in FIG. 8, a polyimide film 5 is applied to passivation film 4 in order to protect the semiconductor device and this polyimide film 5 is patterned so as to create an opening 5a above the fuse portion.

Next, as shown in FIG. 9, passivation film 4 above fuse 11 is removed through dry etching. Here, since insulating film 2 above fuse 11 is thick as described above, it is necessary to reduce the thickness of insulating film 2 above fuse 11. Concretely, dry etching is carried out again so as to etch off approximately 100 nm to 300 nm of insulating film 2 above fuse 11.

When insulating film 2 above fuse 11 is formed as described above, not only the thickness of insulating film 2 above fuse 11 becomes great due to the carrying out of the flattening process but, also, the uniformity of the thickness of this insulating film 2 is lowered. In addition to that, etching becomes necessary in order to reduce the thickness of insulating film 2 as described above and, therefore, the dispersion of the thickness of insulating film 2 above fuse 11 becomes greater. Accordingly, it becomes difficult to blow the fuse in a stable manner.

SUMMARY OF THE INVENTION

The present invention is provided to solve the above described problem. A purpose of the present invention is to blow a fuse in a stable manner.

According to one aspect of the present invention, a semiconductor device is provided with a first metal wire formed above a semiconductor substrate with a first insulating film intervened, a fuse formed on the first insulating film so as to be spaced at a distance away from the first metal wire, a second insulating film which covers the first metal wire and which has a first opening above the fuse, a second metal wire formed on the second insulating film, a first passivation film that covers the second metal wire and the fuse and a second passivation film formed on the first passivation film, made of a material different from that of the first passivation film and having a second opening above the fuse.

The above described flattening process is applied to the second insulating film formed between the first and the second metal wires so that the thickness of the second insulating film becomes great and the dispersion of the thickness is great. Therefore, by providing the first opening in the second insulating film as described above, the second insulating film above the fuse can be removed. On the other hand, the flattening process as described above is not carried out on the first passivation film, so that the first passivation film can be formed of only the deposition of an insulating film. Since this first passivation film extends over the fuse, the thickness of the insulating film located above the fuse can be made smaller and more uniform than that according to the prior art. In addition, since passivation films of different materials are layered, the film of which the thermal stress is smaller can be arranged as the lower layer. Thereby, the stress applied to the metal wires and the fuse due to the passivation films can be released.

The above semiconductor device may be provided with a memory cell array portion in which memory cells are formed and a fuse portion in which a fuse is formed. In this case, the first and the second metal wires are formed in the memory cell array portion. The present invention is useful for such a semiconductor memory device.

The above first passivation film includes an oxide film of which the thickness is no less than 150 nm and no more than 300 nm while the second passivation film includes a nitride film of which the thickness is no less than 500 nm and no more than 800 nm.

By utilizing an oxide film of the above described thickness as a first passivation film in the lower layer, the stress received by a metal wire, or the like, due to the heat can be effectively relieved so that defects or positional shift of the metal wire, or the like, can be prevented. Here, the oxide film is effective for stress relief in the case that the thickness of the oxide film is 100 nm, or more. In addition, by utilizing a nitride film of the above described thickness as a second passivation film in the upper layer, a sufficient withstanding property against moisture can be secured.

The above described semiconductor device is preferably provided with a protective film which covers the fuse and the first metal wire. In this case, the first passivation film is formed so as to cover this protective film.

By forming a protective film in such a manner, the protective film can be used as an etching stopper at the time when an opening is created in the second insulating film located above the fuse.

The above second insulating film includes an oxide film while the protective film includes a nitride film of which the thickness is no less than 150 nm and no more than 300 nm.

In the case that the second insulating film is formed of an oxide film, by using the nitride film of the above described film thickness as a protective film, the protective film can be made to effectively function as an etching stopper.

The first passivation film extends within the first opening and has a recess above the fuse. In this case, a sidewall insulating film is formed on the sidewalls of the recess.

By forming the sidewall insulating film on the sidewalls of the recess in the first passivation film above the fuse in such a manner, insulating film above the fuse, or around the fuse, can be prevented from rupturing or blowing up in an excessive manner at the time of the blowing of the fuse.

According to another aspect of the present invention, a semiconductor device is provided with a first metal wire formed above a semiconductor substrate with a first insulating film intervened, a metal pad layer formed on the first insulating film so as to be spaced at a distance away from the first metal wire, a second insulating film that covers the first metal wire and the metal pad layer, a second metal wire formed on the second insulating film, a fuse formed on the second insulating film so as to be spaced at a distance away from the second metal wire, a first passivation film that covers the second metal wire and the fuse, and a second passivation film formed on the first passivation film, made of a material different from that of the first passivation film and having an opening above the fuse.

In the case of the present aspect, the first passivation film extends over the fuse and the above opening is provided in the second passivation film so that the thickness of the insulating film located above the fuse can be made small and uniform. In addition, since passivation films of different materials are layered, the stress received by the metal wires, or the like, due to the passivation films can be relieved. Furthermore, a conductive layer, which is in the same layer as the second metal wire, is utilized as a fuse and, therefore, the position of the fuse can be heightened and it becomes unnecessary to form an opening in the second insulating film.

The above described semiconductor device may be provided with a memory cell array portion in which memory cells are formed and a fuse portion in which a fuse is formed. In this case, the first and the second metal wires are formed within the memory cell array portion while the metal pad layer is formed within the fuse portion. In the case of the present aspect, too, the invention is useful for a semiconductor memory device.

The above described first passivation film includes an oxide film of which the thickness is no less than 150 nm and no more than 300 nm while the second passivation film includes a nitride film of which the thickness is no less than 500 nm and no more than 800 nm. By utilizing the above oxide film and nitride film as the first and the second passivation films, in the same manner as in the case of the above described one aspect, the stress applied to the metal wire, or the like, can be effectively relieved and a sufficient withstanding property against moisture can be secured.

It is preferable to form a sidewall insulating film on portions which cover the sidewalls of the fuse in the first passivation film. Thereby, the insulating film above the fuse or around the fuse can be prevented from rupturing in an excessive manner at the time of the blowing of the fuse.

According to still another aspect of the present invention, a semiconductor device is provided with a first metal wire formed above a semiconductor substrate with a first insulating film intervened, a metal pad layer formed on the first insulating film so as to be spaced at a distance away from the first metal wire, a second insulating film that covers the first metal wire and the metal pad layer, a second metal wire formed on the second insulating film, a fuse formed on the second insulating film so as to be spaced at a distance away from the second metal wire, a first passivation film that covers the second metal wire and the fuse and a second passivation film formed on the first passivation film, so as to cover the second metal wire and the fuse, made of a material different from that of the first passivation film.

The first and second passivation films may both extend over the fuse in such a manner. In this case, the first and the second passivation films can both be formed, solely, of the depositions of the insulating films and, therefore, the thickness of the first and second passivation films can be made small and the film thickness can be made uniform in comparison with the second insulating film to which the flattening process is applied. In addition, since passivation films of different materials are layered, the stress received by the metal wires, or the like, due to the passivation films can be relieved.

According to one aspect of the present invention, a process for a semiconductor device is provided with the following steps. A metal film is formed above a semiconductor substrate with a first insulating film intervened. By patterning this metal film, a first metal wire and a fuse are formed. A second insulating film is formed so as to cover the first metal wire and the fuse. By etching the second insulating film located above the fuse, a first opening is created. A second metal wire is formed on the second insulating film. A first passivation film is formed so as to cover the second metal wire and the fuse. A second passivation film, of which the material is different from that of the first passivation film, is formed on the first passivation film. By etching the second passivation film positioned above the fuse, a second opening, which reaches to the first passivation film, is created.

By creating the first opening in the second insulating film and by making the first passivation film extend over the fuse as described above, an insulating film, of which the film thickness is small and is uniform, can be formed on the fuse. In addition, since passivation films of different materials are layered, stress received by the metal wire, or the like, due to the passivation films can be relieved.

The above described step of forming the second insulating film preferably includes the step of forming a protective film of a material different from that of the second insulating film so as to cover the first metal wire and the fuse and the step of forming a second insulating film on the protective film. In addition, the step of forming the first opening includes the step of stopping the etching of the second insulating film, that is on the protective film.

By forming a protective film in such a manner, the protective film can be made to function as an etching stopper so that the etching of the second insulating film can be stopped at the protective film.

According to another aspect of the present invention, a process for a semiconductor device is provided with the following steps. A first metal film is formed above a semiconductor substrate with a first insulating film intervened.

By patterning the first metal film, a first metal wire and a metal pad layer are formed. A second insulating film is formed so as to cover the first metal wire and the metal pad layer. A second metal film is formed on the second insulating film. By patterning the second metal film, a second metal wire and a fuse are formed. A first passivation film is formed so as to cover the second metal wire and the fuse. A second passivation film, of which the material is different from that of the first passivation film, is formed on the first passivation film. By etching the second passivation film located above the fuse, an opening which reaches to the first passivation film is created.

In the present aspect, too, since the first passivation film extends over the fuse, an insulating film, of which the thickness is small and is uniform, can be formed above the fuse. In addition, since passivation films of different materials are layered, stress received by the metal wires, or the like, due to the passivation films can be relieved. Furthermore, since the fuse is formed on the second insulating film, it becomes unnecessary to create an opening in the second insulating film in order to reduce the thickness of the insulating film above the fuse. Furthermore, since the second metal wire and the fuse can be formed in the same layer, the position of the fuse can be heightened.

The foregoing and other objects, features, aspects and advantages of the present invention will become more apparent from the following detailed description of the present invention when taken in conjunction with the accompanying drawings.

PREFERRED EMBODIMENTS OF THE INVENTION

In the following, the embodiments of the present invention are described in reference to FIGS. 1 to 3. Here, though in the following the case wherein the present invention is applied to a DRAM (semiconductor memory device) is described, the present invention is applicable to other semiconductor devices that have a fuse.
(First Embodiment)

Figure 1:
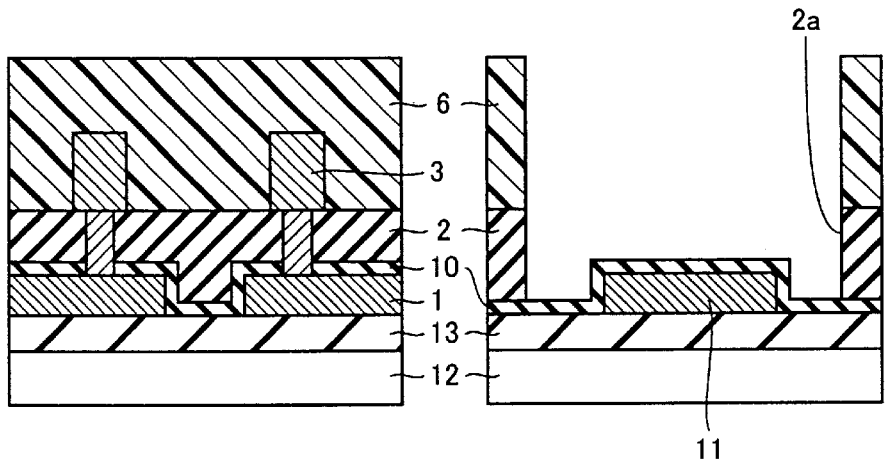
FIGS. 1 and 2 are cross sectional views showing the first and the second steps of a process for a semiconductor device according to a first embodiment of the present invention.
Figure 2:
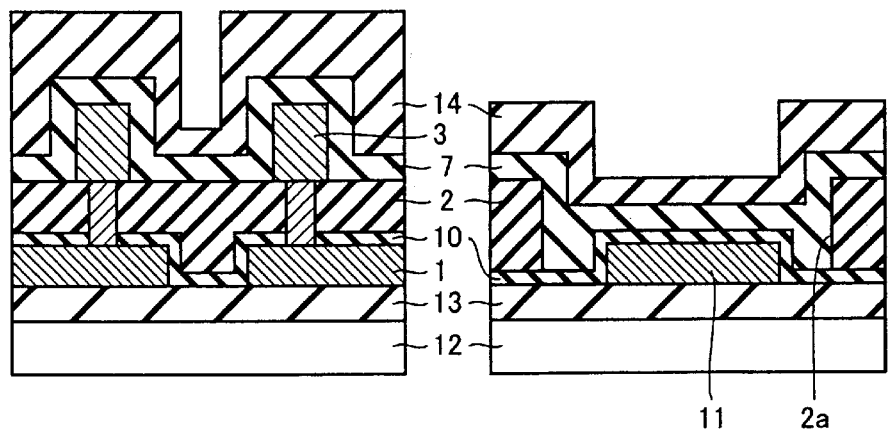

FIGS. 1 and 2 are cross sectional views showing a characteristic process for a semiconductor device according to a first embodiment of the present invention. FIG. 3 is a cross sectional view showing a semiconductor device according to the first embodiment.

As shown in FIG. 1, a metal film (Al alloy film), such as Al—Cu or Al—Si—Cu, is deposited above a semiconductor substrate 12 with an interlayer insulating film 13 intervened and dry etching, such as an RIE (reactive ion etching) method, or the like, is carried out by using a photoresist mask so as to pattern this metal film. Thereby, first metal wires (first Al wires) 1 are formed in a memory cell array portion while fuse 11 made of the above described Al alloy, or the like, is formed in a fuse portion.

Fuse 11 is provided for relieving or compensating for defects within the memory cell array portion so that an address corresponding to a defective cell is allocated to a redundancy cell by cutting off fuse 11 when the defective cell is detected.

Here, a large number of memory cells (not shown) are formed on semiconductor substrate 12 in the memory cell array portion and these memory cells are covered with interlayer insulating film 13. A peripheral circuit portion, wherein a peripheral circuit for controlling the operation of the memory cells is formed, is provided so as to adjoin the memory cell array portion and the above fuse portion is provided in the peripheral circuit portion.

Next, a protective film 10 is deposited so as to cover first metal wires 1 and fuse 11 by means of a CVD (chemical vapor deposition) method, or the like. As for protective film 10, it is preferable to use a nitride film of which the thickness is approximately 150 nm to 300 nm.

After that, an insulating film, such as an oxide film ($SiO_2$), is deposited so as to cover protective film 10. At this time, an insulating film is deposited so as to fill in the spaces between first metal wires 1 or between first metal wires 1 and fuse 11 and, after this deposition, the insulating film is flattened by means of CMP and, then, another insulating film, such as an oxide film ($SiO_2$), is deposited. Thereby, a thick insulating film 2 can be formed.

Insulating film 2 is selectively etched by using a photoresist mask so that contact holes are created above first metal wires 1 and a conductive layer is filled into these contact holes.

Next, a metal film similar to the above is deposited and this metal film is patterned by carrying out dry etching, such as by an RIE method, using a photoresist mask. Thereby, second metal wires 3 are formed in the memory cell array portion. At this time, no metal films are allowed to remain above fuse 11.

Next, a photoresist 6 is applied to insulating film 2 and an opening is created in photoresist 6 located above the fuse portion. Dry etching is carried out on insulating film 2 by using this photoresist 6 as a mask. Thereby, as shown in FIG. 1, protective film 10 is exposed above fuse 11. At this time, insulating film 2 is etched under the conditions wherein selectivity for nitride film is high and this etching is stopped at protective film 10.

Next, photoresist 6 is removed and, as shown in FIG. 2, a first passivation film 7 is deposited so as to cover second metal wires 3 and protective film 10 above the fuse portion by means of a CVD method, or the like. As for first passivation film 7, it is preferable to use an oxide film of which the thickness is approximately 150 nm to 300 nm.

First passivation film 7 is formed through a deposition of a film as described above and no flattening process is carried out. Therefore, the dispersion of the thickness of first passivation film 7 is smaller than the dispersion of the thickness of insulating film 2 described before.

In addition, since first passivation film 7 extends within an opening 2a, a recess is created in the surface located above fuse 11. The diameter of the opening of this recess is greater than the width of fuse 11.

Next, a second passivation film 14 is deposited on first passivation film 7 by means of a CVD method, or the like. As for second passivation film 14, it is preferable to use a nitride film (SiN, or the like) of which the thickness is approximately 500 nm to 800 nm and which is excellent in withstanding properties against moisture.

Figure 3:
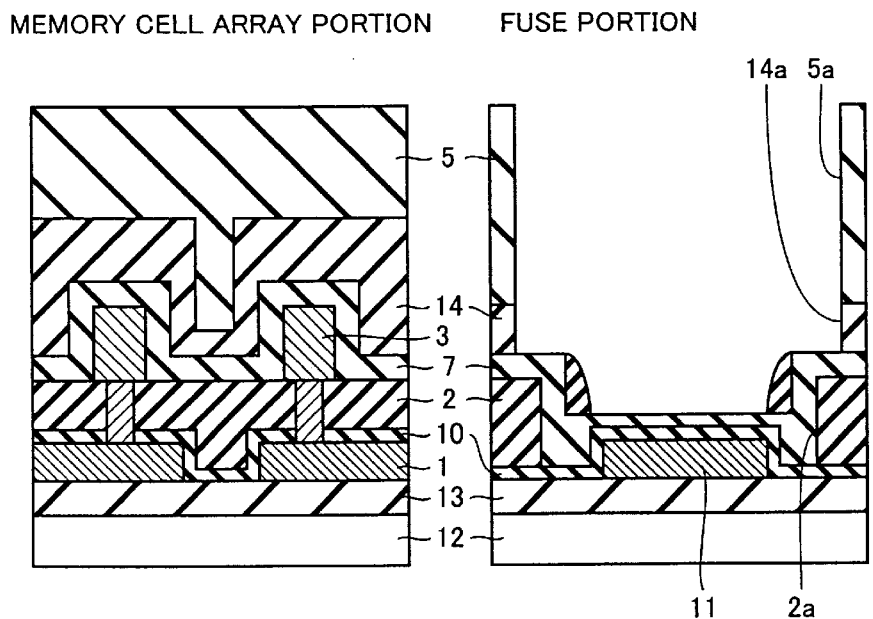
FIG. 3 is a cross sectional view of the semiconductor device according to the first embodiment of the present invention.

Next, as shown in FIG. 3, a light sensitive polyimide film 5 is applied to second passivation film 14 in order to protect the semiconductor device and opening 5*a* is created above the fuse portion by patterning this polyimide film 5 and, then, second passivation film 14 is etched above fuse 11 through dry etching, such as by an RIE method.

Thereby, an opening 14*a* is created which reaches to first passivation film 7. At this time, the surface of first passivation film 7 located above fuse 11 is exposed and, at the same time, a sidewall insulating film 8 is formed on the sidewalls of the recess in the surface of first passivation film 7 located within opening 14*a*. This sidewall insulating film 8 is formed so as to surround fuse 11.

By creating opening 14*a* above fuse 11 as described above, fuse 11 is covered by only first passivation film 7. Accordingly, first passivation film 7 ruptures or blows up at the time of the blowing of the fuse.

As described above, the passivation film is formed of a layered structure of a plurality of films (for example, an oxide film and a nitride film) of which the thermal stresses are different and, thereby, a film of a small thermal stress can be made to function as a stress relieving film. Thereby, a stress due to the passivation film, that occurs in the case when heat is applied, can be relieved so that first metal wires 1 and fuse 11 can be prevented from being damaged.

In addition, by using a multilayered passivation film, the lower passivation film only can be allowed to extend above fuse 11 so that the thickness of the insulating film located above fuse 11 can be reduced.

Furthermore, protective film 10 is formed so as to cover fuse 11 and, therefore, insulating film 2, of which the thickness is great and of which the uniformity of thickness is poor, can be removed through etching above fuse 11 by using protective film 10 as an etching stopper. Therefore, the insulating film located above fuse 11 becomes a layered film of protective film 10 and first passivation film 7, of which the thickness is small in comparison with that of insulating film 2. This can also contribute to making the insulating film located above fuse 11 thinner.

In addition, protective film 10 and first passivation film 7 can be formed only through depositions of insulating films and, therefore, the uniformity of the film thickness is superior to that of insulating film 2, which is formed through a flattening process. Accordingly, the uniformity of the thickness of the insulating film located above fuse 11 can be increased so that the blowing of the fuse can be carried out in a stable manner.

Furthermore, by forming a sidewall insulating film 8 on the sidewalls of the recess located above fuse 11, first passivation film 7 or insulating film 2 located around fuse 11 can be protected at the time of the blowing of the fuse. Thereby, the reliability of the semiconductor device after the blowing of the fuse can be increased.

(Second Embodiment)

Next, a second embodiment of the present invention is described.

Though in the above described first embodiment, the passivation film is of two layers, the passivation film may be formed of a multilayered film of three layers, or more. Thereby, similar effects as those in the first embodiment can be expected.

Here, in the case of the second embodiment, too, it is preferable to form the first layer (lower layer) in the passivation film of an oxide film.

(Third Embodiment)

Figure 4:
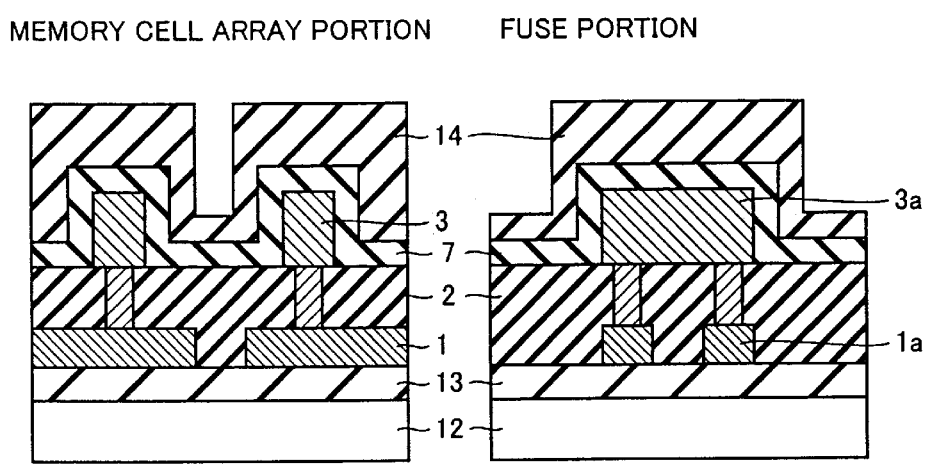
FIG. 4 is a cross sectional view showing a characteristic process for a semiconductor device according to a third embodiment of the present invention.
Figure 5:
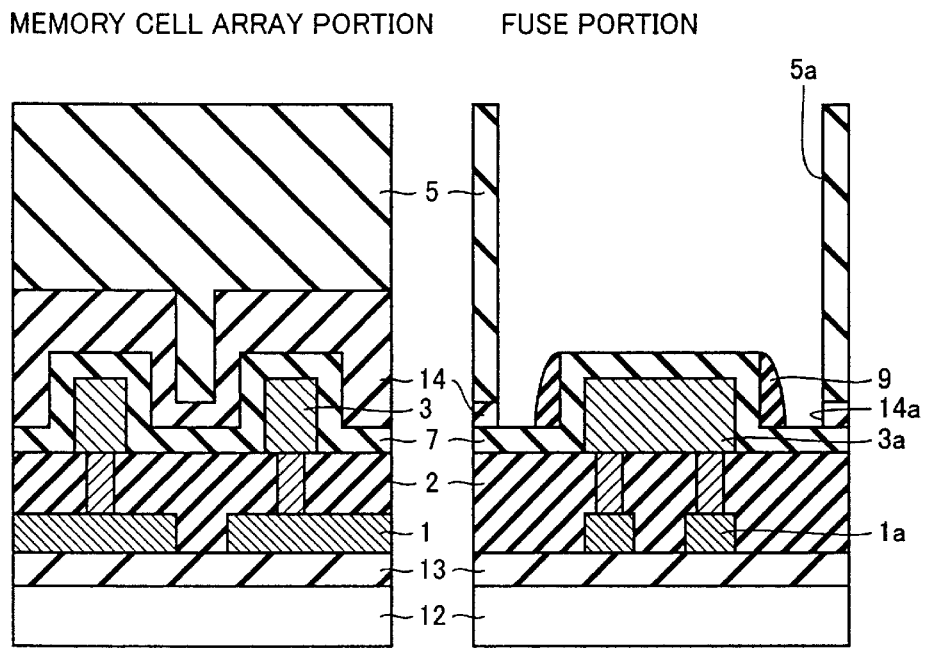
FIG. 5 is a cross sectional view of the semiconductor device according to the third embodiment of the present invention.

Next, a third embodiment of the present invention is described in reference to FIGS. 4 and 5. FIG. 4 is a cross sectional view showing a characteristic process for a semiconductor device according to the present embodiment while FIG. 5 is a cross sectional view of the semiconductor device according to the present embodiment.

As shown in FIG. 4, a metal film similar to that in the first embodiment is deposited above semiconductor substrate 12 with interlayer insulating film 13 intervened and this metal film is patterned by means of the same method as in the first embodiment. Thereby, first metal wires 1 are formed in the memory cell array portion and a pad 1*a* is formed in the fuse portion.

Next, insulating film 2 is deposited by means of the same method as in the first embodiment. Then, contact portions for making a connection between the upper and lower metal films are formed in not only the memory cell array portion but, also, in the fuse portion. Concretely, contact holes are created in insulating film 2 located within the memory cell array portion and, at the same time, contact holes are created in insulating film 2 located within the fuse portion and a conductive film is filled into these contact holes.

After that, a metal film similar to that of the first embodiment is deposited on the above described contact portions and, by patterning this metal film, second metal wires 3 are formed within the memory cell array portion while fuse 3*a* is formed within the fuse portion.

Next, first and second passivation films 7, 14 are formed so as to cover second metal wires 3 and a fuse 3*a* by means of the same method as in the first embodiment and, as shown in FIG. 5, polyimide film 5 is formed so as to cover these films.

This polyimide film 5 is patterned to a predetermined form so as to create opening 5*a* above the fuse portion and second passivation film 14 is etched through dry etching, such as by an RIE method, so as to create opening 14*a*. At this time, a sidewall insulating film 9 is formed on the sidewalls of first passivation flm 7 which covers fuse 3*a*. This sidewall insulating film 9 is formed so as to surround fuse 3*a*.

In the case of the third embodiment, too, stress due to the passivation film can be relieved in the same manner as in the case of the first embodiment. In addition, only the lower layer of passivation film 7 extends above fuse 3*a* and, therefore, the thickness of the insulating film located above fuse 11 can be reduced.

Furthermore, first passivation film 7 can be formed only through deposition so that the uniformity of the thickness of the insulating film located above fuse 3*a* can be increased in comparison with that in the prior art and, thereby, a stable blowing of the fuse can be carried out.

Furthermore, by forming sidewall insulating film 9 on the sidewalls of first passivation film 7, which covers fuse 3*a*, first passivation film 7 or insulating film 2 located around fuse 3*a* can be protected at the time of the blowing of the fuse. Thereby, the reliability of the semiconductor device after the blowing of the fuse can be increased.

(Fourth Embodiment)

Figure 6:
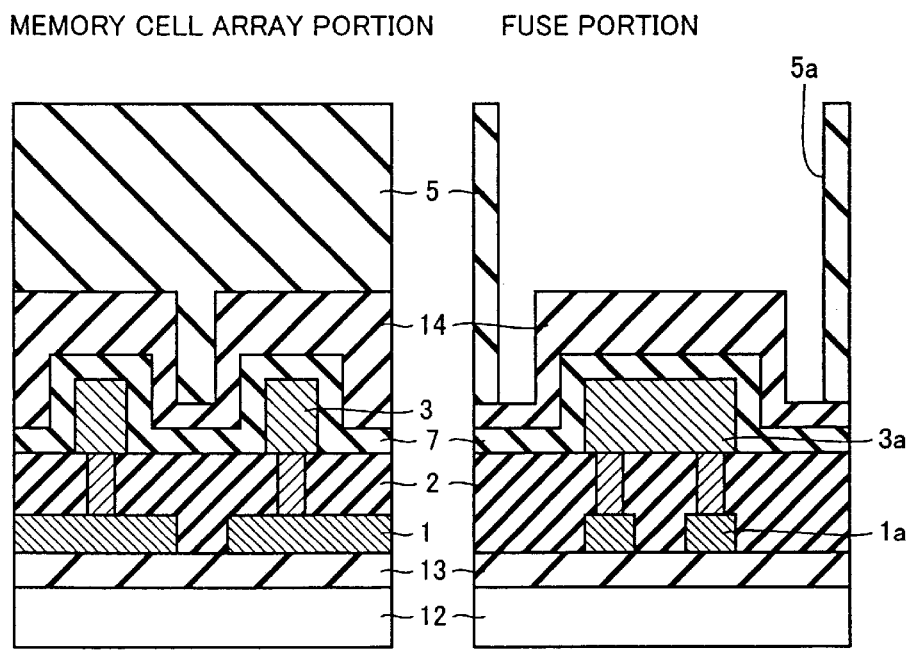
FIG. 6 is a cross sectional view of a semiconductor device according to a fourth embodiment of the present invention.
Figure 7:
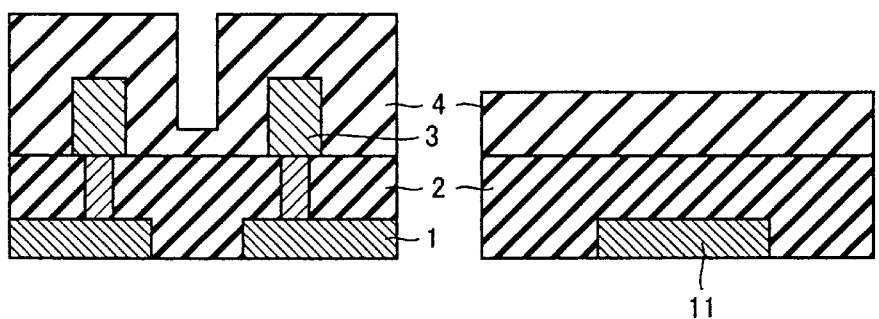
FIGS. 7 and 8 are cross sectional views showing the first and the second steps of a process for a semiconductor device according to a prior art.
Figure 8:
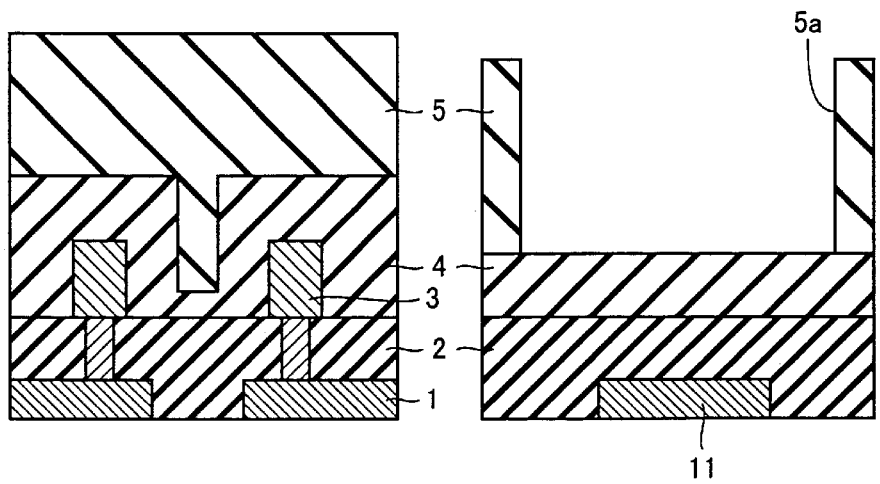
Figure 9:
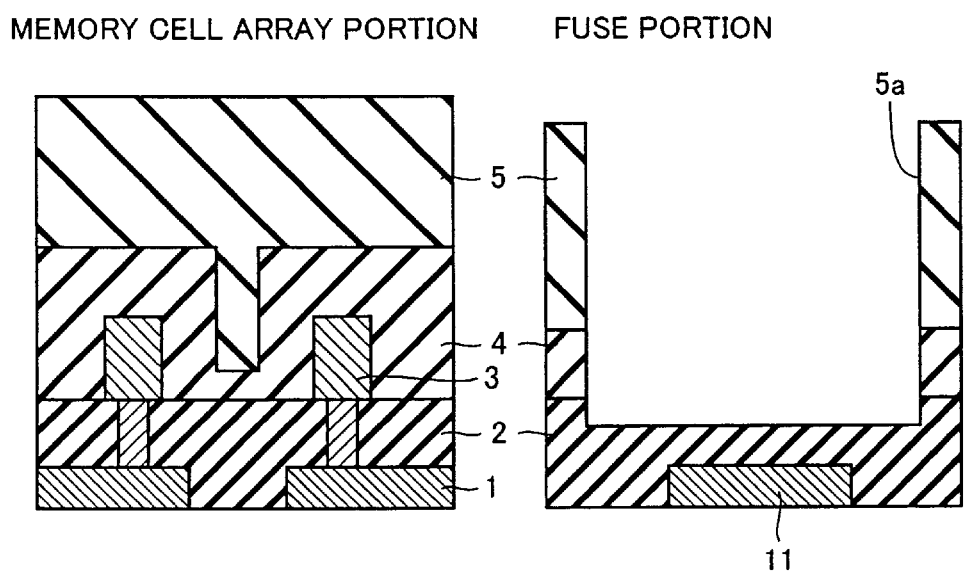
FIG. 9 is a cross sectional view of the semiconductor device according to the prior art.

Next, a fourth embodiment of the present invention is described in reference to FIG. 6. FIG. 6 is a cross sectional view of a semiconductor device according to the present embodiment.

As shown in FIG. 6, the structure up to second passivation film 14 is formed by means of the same method as in the third embodiment and polyimide film 5 is formed so as to cover second passivation film 14. Then, opening 5a is created in polyimide film 5 located above the fuse portion. At this time, second passivation film 14 is not etched and remains above fuse 3a.

That is to say, first and second passivation films 7, 14 are both allowed to extend above fuse 3a in the present embodiment.

In the case of the fourth embodiment, too, stress due to the passivation film can be relieved in the same manner as in the case of the first embodiment.

In addition, since the thickness of first and second passivation films 7, 14 is smaller than the thickness of the insulating film 2, the thickness of the insulating film located above fuse 11 can be reduced in comparison with that in the prior art.

Furthermore, since first and second passivation films 7 can be formed only through the deposition of insulating films, the uniformity of the thickness of the insulating film located above fuse 3a can be increased in comparison with that in the prior art so as to carry out a stable blowing of the fuse.

According to the present invention, the thickness of the insulating film located above the fuse can be made small and uniform and, therefore, a stable blowing of the fuse can be carried out. In addition, by forming the passivation film of multilayered film, stress due to the passivation film received by the metal wires or the fuse can be relieved and, thereby, defects, positional shift, or the like, of the metal wires caused by such stress can be prevented. Thereby, the reliability of the semiconductor device can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first metal wire formed above a semiconductor substrate with a first insulating film intervened;
   a fuse formed on said first insulating film so as to be spaced at a distance away from said first metal wire;
   a second insulating film that covers said first metal wire and that has a first opening above said fuse;
   a second metal wire formed on said second insulating film;
   a first passivation film that covers said second metal wire and completely covers said fuse; and
   a second passivation film formed on said first passivation film, made of a material different from that of said first passivation film and having a second opening above said fuse.

2. The semiconductor device according to claim 1,
   wherein said semiconductor device comprises a memory cell array portion in which memory cells are formed and a fuse portion in which said fuse is formed, and
   said first and second metal wires are formed in said memory cell array portion.

3. The semiconductor device according to claim 1,
   wherein said first passivation film includes an oxide film of which the thickness is no less than 150 nm and no more than 300 nm, and
   said second passivation film includes a nitride film of which the thickness is no less than 500 nm and no more than 800 nm.

4. The semiconductor device according to claim 1, further comprising a protective film which covers said fuse and said first metal wire, wherein said first passivation film is formed so as to cover said protective film.

5. The semiconductor device according to claim 4,
   wherein said second insulating film includes an oxide film, and
   said protective film includes a nitride film of which the thickness is no less than 150 nm and no more than 300 nm.

6. The semiconductor device according to claim 1,
   wherein said first passivation film extends within said first opening so as to have a recess above said fuse, and
   a sidewall insulating film is formed on the sidewalls of said recess.

7. A semiconductor device, comprising:
   a first metal wire formed above a semiconductor substrate with a first insulating film intervened;
   a metal pad layer formed on said first insulating film so as to be spaced at a distance away from said first metal wire;
   a second insulating film that covers said first metal wire and said metal pad layer;
   a second metal wire formed on said second insulating film;
   a fuse formed on said second insulating film so as to be spaced at a distance away from said second metal wire;
   a first passivation film that covers said second metal wire and completely covers said fuse; and
   second passivation film formed on said first passivation film, made of a material different from that of said first passivation film and having an opening above said fuse.

8. The semiconductor device according to claim 7,
   wherein said semiconductor device comprises a memory cell array portion in which memory cells are formed and a fuse portion in which said fuse is formed,
   said first and second metal wires are formed within said memory cell array portion, and
   said metal pad layer is formed within said fuse portion.

9. The semiconductor device according to claim 7,
   wherein said first passivation film includes an oxide film of which the thickness is no less than 150 nm and no more than 300 nm, and
   said second passivation film includes a nitride film of which the thickness is no less than 500 nm and no more than 800 nm.

10. The semiconductor device according to claim 7, wherein a sidewall insulating film is formed on a portion of said first passivation film that covers the sidewalls of said fuse.

11. A semiconductor device, comprising:
    a first metal wire formed above a semiconductor substrate with a first insulating film intervened;
    a metal pad layer formed on said first insulating film so as to be spaced at a distance away from said first metal wire;
    a second insulating film that covers said first metal wire and said metal pad layer;
    a second metal wire formed on said second insulating film;
    a fuse formed on said second insulating film so as to be spaced at a distance away from said second metal wire;
    a first passivation film that covers said second metal wire and completely covers said fuse; and
    a second passivation film formed on said first passivation film so as to cover said second metal wire and said fuse and made of a material different from that of said first passivation film.

* * * * *